(12) United States Patent
Sumita

(10) Patent No.: US 7,823,111 B2
(45) Date of Patent: Oct. 26, 2010

(54) SEMICONDUCTOR INTEGRATED CIRCUIT DEVICE, SEMICONDUCTOR INTEGRATED CIRCUIT DESIGN METHOD, AND SEMICONDUCTOR INTEGRATED CIRCUIT DESIGN APPARATUS

(75) Inventor: Masaya Sumita, Hyogo (JP)

(73) Assignee: Panasonic Corporation, Osaka (JP)

( * ) Notice: Subject to any disclaimer, the term of this patent is extended or adjusted under 35 U.S.C. 154(b) by 359 days.

(21) Appl. No.: 12/022,825

(22) Filed: Jan. 30, 2008

(65) Prior Publication Data

US 2008/0238486 A1 Oct. 2, 2008

(30) Foreign Application Priority Data

Mar. 30, 2007 (JP) .............................. 2007-095158

(51) Int. Cl.
G06F 17/50 (2006.01)
G06F 9/455 (2006.01)
H03K 17/693 (2006.01)
H03K 3/01 (2006.01)
H03L 7/06 (2006.01)
G06G 7/28 (2006.01)

(52) U.S. Cl. ................................ 716/11; 716/9; 716/10; 716/15; 716/16; 327/156; 327/333; 327/534

(58) Field of Classification Search ...................... 716/9, 716/10, 15, 16; 327/156, 333, 534
See application file for complete search history.

(56) References Cited

U.S. PATENT DOCUMENTS 5,270,584 A * 12/1993 Koshikawa et al. ......... 327/534
5,590,361 A * 12/1996 Iwamura et al. ............... 712/32

(Continued)

FOREIGN PATENT DOCUMENTS

JP 3212915 9/1991

(Continued)

OTHER PUBLICATIONS

Dai et al.; MOSIZ: a two-step transistor sizing algorithm based on optimal timing assignment method for multi-stage complex gates; Publication Year: 1989 ; Custom Integrated Circuits Conference, 1989., Proceedings of the IEEE 1989 pp. 17.3/1-17.3/4.*

(Continued)

Primary Examiner—Helen Rossoshek
(74) Attorney, Agent, or Firm—McDermott Will & Emery LLP

(57) ABSTRACT

A semiconductor integrated circuit design method includes a step (L) of providing layout information for laying out elements making up a logical circuit on a semiconductor substrate; a step (P) of providing logical circuit information; a step (a) of classifying logical circuits in response to the logical circuit propagation route of a signal based on the logical circuit information and a step (b) of isolating the logical circuits forming the route obtained in the classifying step (a) for each number of stages; a step (c) of classifying the elements making up the logical circuit according to substrate voltage for each number of stages of the logical circuit; and a layout correction step (d) of correcting the layout information so that each element with the larger stage number of the logical circuit is placed at a point closer to a substrate contact.

6 Claims, 10 Drawing Sheets

U.S. PATENT DOCUMENTS

| | | |
|---|---|---|
| 6,661,274 B1 * | 12/2003 | Naka et al. ............... 327/333 |
| 2004/0014268 A1 | 1/2004 | Ishibashi et al. |
| 2005/0005254 A1 * | 1/2005 | Hirano et al. ............... 716/5 |
| 2009/0059646 A1 * | 3/2009 | Takahashi et al. ......... 365/145 |
| 2009/0146703 A1 * | 6/2009 | Suda ........................ 327/156 |

FOREIGN PATENT DOCUMENTS

| | | |
|---|---|---|
| JP | 11-068045 | 3/1999 |
| JP | 11-195976 | 7/1999 |

OTHER PUBLICATIONS

Kuroda, Tadahiro et al. "A High-Speed Low-Power 0.3um CMOS Gate Array with Variable Threshold Voltage (VT) Scheme." Toshiba Corp., Kawasaki, Japan, IEEE 1996 Custom Integrated Circuits Conference, p. 53-56.

Miyazaki, Masayuki et al. "A 175mV Multiply-Accumulate Unit using an Adaptive Supply Voltage and Body Bias (ASB) Architecture." MIT, Cambridge, MA. 2002 IEEE International Solid-State Circuits Conference.

* cited by examiner

FIG. 4 (a)

TABLE 1
NUMBER OF LOGICAL STAGES
AND SUBSTRATE VOLTAGE

| NUMBER OF LOGICAL STAGES | SUBSTRATE VOLTAGE |
|---|---|
| 1-20 | 0-0.2V |
| 21-22 | 0.2V-0.3V |
| 23-24 | 0.3V-0.45V |
| 25- | 0.45V |

FIG. 4 (b)

TABLE 2
NUMBERS OF SUBSTRATE CONTACTS BASED ON SUBSTRATE
POTENTIAL AVERAGE VALUE AND VARIANCE CONCERNING
NUMBER-OF-LOGICAL-STAGES FREQUENCIES

| SUBSTRATE POTENTIAL AVERAGE VALUE | VARIANCE | NUMBER OF NWELL SUBSTRATE CONTACTS | NUMBER OF PWELL SUBSTRATE CONTACTS |
|---|---|---|---|
| 0-0.2V | 0.1 | 1 | 20 |
| 0-0.2V | 0.2 | 1 | 40 |
| 0-0.2V | 0.3 | 1 | 60 |
| 0-0.2V | 0.5 | 2 | 100 |
| 0-0.3V | 0.1 | 1 | 50 |
| 0.3V-0.45V | 0.1 | 2 | 200 |
| 0.45V | 0.1 | 2 | 200 |

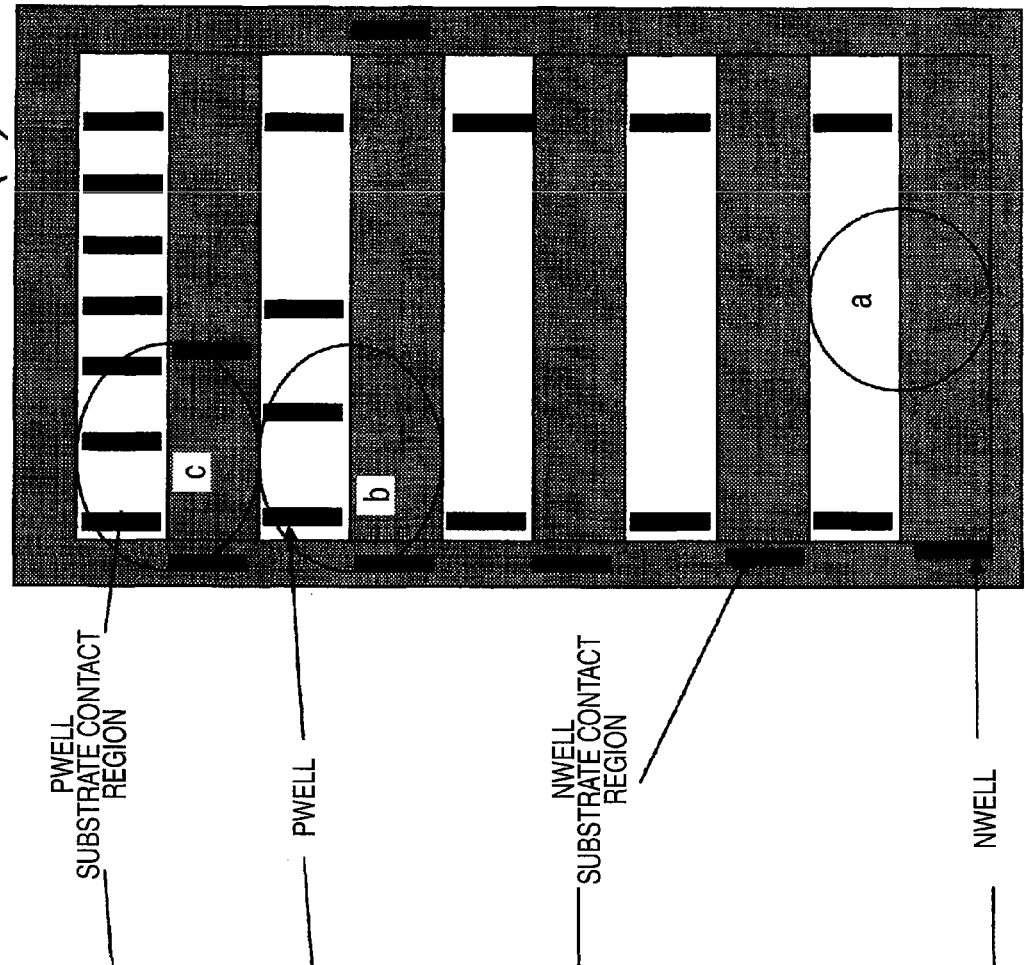
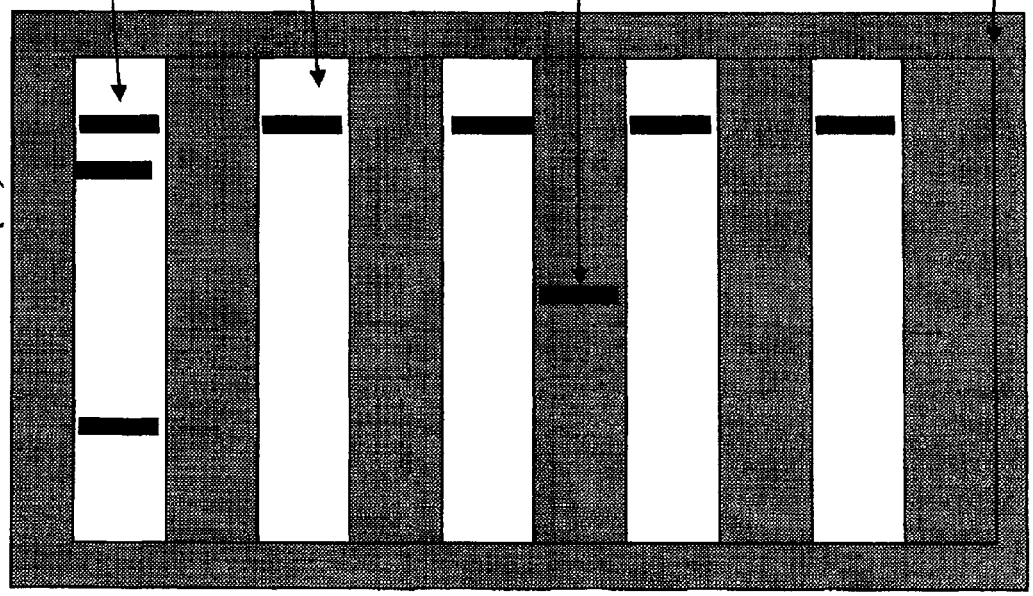

FIG. 9 (a)

TABLE 1B
DELAY TIME AND SUBSTRATE
VOLTAGE

| DELAY TIME nsec | SUBSTRATE VOLTAGE |
|---|---|
| 1–2.0 | 0–0.2V |
| 2.1–2.2 | 0.2V–0.3V |
| 2.3–2.4 | 0.3V–0.45V |
| 2.5– | 0.45V |

FIG. 9 (b)

TABLE 2B
NUMBERS OF SUBSTRATE CONTACTS BASED ON SUBSTRATE
POTENTIAL AVERAGE VALUE AND VARIANCE CONCERNING
DELAY TIME FREQUENCIES

| SUBSTRATE POTENTIAL AVERAGE VALUE | VARIANCE | NUMBER OF NWELL SUBSTRATE CONTACTS | NUMBER OF PWELL SUBSTRATE CONTACTS |
|---|---|---|---|
| 0–0.2V | 0.1 | 1 | 20 |
| 0–0.2V | 0.2 | 1 | 40 |
| 0–0.2V | 0.3 | 1 | 60 |
| 0–0.2V | 0.5 | 2 | 100 |
| 0–0.3V | 0.1 | 1 | 50 |
| 0.3V–0.45V | 10 | 2 | 200 |
| 0.45V | 0.1 | 2 | 200 |

SEMICONDUCTOR INTEGRATED CIRCUIT DEVICE, SEMICONDUCTOR INTEGRATED CIRCUIT DESIGN METHOD, AND SEMICONDUCTOR INTEGRATED CIRCUIT DESIGN APPARATUS

BACKGROUND OF THE INVENTION

1. Field of the Invention

This invention relates to a semiconductor integrated circuit device, a semiconductor integrated circuit design method, and a semiconductor integrated circuit design apparatus and in particular to smaller area, speeding up, and lower power consumption to which a substrate control technology is applied in a semiconductor integrated circuit having MOS transistors.

2. Description of the Related Art

In a semiconductor integrated circuit, the substrate potential of a MOS transistor (MOS element) may be controlled for use, because there is a feature that the threshold value and the saturation current characteristic of the MOS transistor can be made variable by changing the substrate potential of the MOS transistor. As an example of making the most of the feature, a method of making the substrate potential of the MOS transistor variable between the operation time and the stop time of the semiconductor integrated circuit is available. Specifically, the following method is available: When the semiconductor integrated circuit operates, the potential difference between the substrate potential and the source potential of the MOS transistor is set to zero and when the semiconductor integrated circuit stops, the potential difference between the substrate potential and the source potential is taken large, whereby the threshold value of the MOS transistor at the stop time is made larger than that at the operation time and the subthreshold leak current of the MOS transistor is reduced, whereby lower power consumption is accomplished. (Refer to non-patent document 1.)

To implement the substrate control of the MOS transistor described above, a layout technique to provide good area efficiency of a semiconductor integrated circuit is proposed. (Refer to patent document 1.)

Further, a method of implementing a layout while maintaining high speed and lower power consumption by supplying separate substrate potentials to different substrates at the operation time is proposed. (Refer to patent document 2.)

On the other hand, the following method is also proposed: According to a forward substrate voltage application control technology (FBB substrate control technology) for applying a higher voltage than that of the source of a MOS transistor to the substrate of the MOS transistor, the threshold value of the MOS transistor is decreased, characteristic variations in the MOS transistor are suppressed, and operation at the usual power supply voltage or less is made possible, whereby further lower power consumption can be accomplished. (Refer to non-patent document 1.)

Non-patent document 1: T. Kuroda et al., "A High-Speed Low-Power 0.3 urn CMOS Gate Array with Variable Threshold Voltage Scheme," IEEE Custom Integrated Circuit Conference 1996 PP. 53-56

Non-patent document 2: M. Miyazaki et al., "A 175 mA Multiply-Accumulate Unit Using an Adaptive Supply Voltage and Body Bias (ASB) Architecture," IEEE ISSCC 2002 3.4

Patent document 1: Japanese Patent No. 3212915
Patent document 2: Japanese Patent No. 3777768

Hitherto, various technologies have been proposed as described above; a unique substrate potential had been supplied to one substrate forming a MOS transistor (for NMOS, the substrate is PWELL and for PMOS, the substrate is NWELL). Therefore, to supply a different substrate potential to each MOS transistor, separate PWELL and NWELL are formed, WELLs of the same polarity must be physically isolated, and there is a problem of a disadvantage with respect to the area as compared with the case where the substrates of all MOS transistors are set to the same potential. Further, as for placement of substrate contacts, hitherto, the distance between the substrate contacts has not been defined and the number of substrate contacts may become more than the necessary number for implementing the essential characteristics of a semiconductor integrated circuit; there is also a problem of furthermore increasing the area of the semiconductor integrated circuit.

To give a different substrate potential to each WELL, although the speed at the operation time can be improved, a passage which need not be speeded up in each MOS transistor on one WELL also becomes high speed and there is a problem of an increase in leak current, etc. Particularly, as described above, in the forward substrate voltage application control technology for applying a higher voltage than that of the source of a MOS transistor, if the source-substrate voltage of the MOS transistor is set to one voltage value or more, the leak current increases because of the effects of a forward diode and a parasitic bipolar. Therefore, the forward substrate voltage application control technology cannot apply a so large substrate voltage and cannot much contribute to performance improvement of MOS; this is a problem of the technology.

That is, a method of implementing a layout for making it possible to accomplish speeding up and lower power consumption more finely while maintaining a smaller area in a semiconductor integrated circuit requiring different substrate potentials does not exist.

SUMMARY OF THE INVENTION

It is therefore an object of the invention to provide a semiconductor integrated circuit intended for compatibility between high speed and low power consumption and being a smaller area and capable of suppressing degradation of the circuit characteristic.

A semiconductor integrated circuit design method of the invention is characterized by the fact that it includes a step (l) of providing layout information for laying out elements making up a logical circuit on a semiconductor substrate; a step (p) of providing logical circuit information; a step (a) of classifying logical circuits in response to the logical circuit propagation route of a signal based on the logical circuit information and a step (b) of isolating the logical circuits forming the route obtained in the classifying step (a) for each number of stages or each delay time; a step (c) of classifying the elements making up the logical circuit according to substrate voltage for each number of stages of the logical circuit; and a layout correction step (d) of correcting the layout information so that each element with the larger stage number or delay time of the logical circuit is placed at a point closer to a substrate contact.

That is, the semiconductor integrated circuit design method of the invention is characterized by the fact that it includes a step (l) of providing layout information for laying out elements making up a logical circuit on a semiconductor substrate; a step (p) of providing logical circuit information; a step (a) of classifying logical circuits in response to the logical circuit propagation route of a signal based on the logical circuit information and a step (b) of isolating the logical circuits forming the route obtained in the classifying step (a) for each number of stages; a step (c) of classifying the elements making up the logical circuit according to substrate voltage for each number of stages of the logical circuit; and a layout correction step (d) of correcting the layout information so that each element with the larger stage number of the logical circuit is placed at a point closer to a substrate contact.

According to this configuration, a high substrate voltage is applied only to a logical circuit where speeding up is required, so that finer substrate control is made possible and a high substrate voltage is not applied to a logical circuit where speeding up is not required and thus an unnecessary leak current can be prevented. If WELL isolation is lessened, the substrate voltage can be adjusted according to element arrangement, so that finer design rules are made possible.

In the semiconductor integrated circuit design method of the invention, the step of providing layout information includes a step of creating layout information based on the logical circuit information.

The layout information can be easily generated based on the logical circuit information. The layout information may be created based on the logical circuit information or if layout information previously exists, the layout information may be used.

In the semiconductor integrated circuit design method of the invention, the step (a) includes a step of extracting a logical circuit only between flip-flop circuits, wherein only the logical circuits extracted in the extracting step are classified.

Although it is also possible to adopt a method of classifying in response to the route in the whole logical circuit information, computation can be more simplified by extracting only the route between flip-flop circuits and classifying.

In the semiconductor integrated circuit design method of the invention, the step (d) is a step of laying out so that a MOS transistor with the larger stage number of the logical circuit is placed at a point closer to the substrate contact.

According to the invention, the logical circuits are classified for each number of stages and each MOS transistor with the larger stage number is placed at a point closer to the substrate contact, so that the circuit can be used in a state in which the substrate voltage is higher, and finer substrate control is made possible in such a manner that a high substrate voltage is applied only to the MOS transistor of a logical circuit where speeding up is required; more speeding up can be accomplished.

In the semiconductor integrated circuit design method of the invention, the step (d) is a step of laying out so that an NMOS transistor of the MOS transistors with the larger stage number of the logical circuit is placed at a point closer to the substrate contact on a priority basis.

According to the invention, the logical circuits are classified for each number of stages and each MOS transistor with the larger stage number is placed at a point closer to the substrate contact, so that the circuit can be used in a state in which the substrate voltage is higher, and finer substrate control is made possible in such a manner that a high substrate voltage is applied only to the MOS transistor of a logical circuit where speeding up is required; more speeding up can be accomplished.

Another semiconductor integrated circuit design method of the invention is characterized by the fact that it includes a step (l) of providing layout information for laying out elements making up a logical circuit on a semiconductor substrate; a step (p) of providing logical circuit information; a step (a) of classifying logical circuits in response to the logical circuit propagation route of a signal based on the logical circuit information and a step (b) of calculating delay times of the logical circuits forming the route obtained in the classifying step (a) and isolating the logical circuits for each delay time; a step (c) of classifying the elements making up the logical circuit according to substrate voltage for each delay time of the logical circuit; and a step (d) of laying out so that each element with the larger delay time of the logical circuit is placed at a point closer to a substrate contact.

At the forward substrate control time, in elements common in WELL, the substrate potential rises without variation and thus the leak current increases. According to the configuration, however, the logical circuits are classified for each delay time and each element with the larger delay time is placed at a point closer to the substrate contact, so that the circuit can be used in a state in which the substrate voltage is higher, and finer substrate control is made possible in such a manner that a high substrate voltage is applied only to the element of a logical circuit where speeding up is required; more speeding up can be accomplished. In addition, the semiconductor integrated circuit can consume lower power and can prevent degradation of the circuit characteristic.

In the semiconductor integrated circuit design method of the invention, the step of providing layout information includes a step of creating layout information based on the logical circuit information.

In the semiconductor integrated circuit design method of the invention, the step (a) includes a step of extracting a logical circuit only between flip-flop circuits, wherein only the logical circuits extracted in the extracting step are classified.

Although it is also possible to adopt a method of classifying in response to the route in the whole logical circuit information, computation can be more simplified by extracting only the route between flip-flop circuits and classifying.

In the semiconductor integrated circuit design method of the invention, the step (d) is a step of laying out so that a MOS transistor with the larger delay time of the logical circuit is placed at a point closer to the substrate contact.

According to the invention, the logical circuits are classified for each delay time and each MOS transistor with the larger delay time is placed at a point closer to the substrate contact, so that the circuit can be used in a state in which the substrate voltage is higher, and finer substrate control is made possible in such a manner that a high substrate voltage is applied only to the MOS transistor of a logical circuit where speeding up is required; more speeding up can be accomplished.

In the semiconductor integrated circuit design method of the invention, the step (d) is a step of laying out so that an NMOS transistor of the MOS transistors with the larger delay time of the logical circuit is placed at a point closer to the substrate contact on a priority basis.

A semiconductor integrated circuit design apparatus of the invention includes means (L) for laying out on a semiconductor substrate and providing layout information; means (R) for providing logical circuit information; means (A) for classifying logical circuits in response to the logical circuit propagation route of a signal based on the logical circuit information; and means (B) for isolating the logical circuits forming the route obtained in the classifying means (A) for each number of stages; means (C) for classifying the elements making up the logical circuit according to substrate voltage for each number of stages of the logical circuit; and layout correction means (D) for correcting the layout information so that each element with the larger stage number of the logical circuit is placed at a point closer to a substrate contact.

According to this configuration, it is made possible to easily lay out the circuit using the design tool.

Another semiconductor integrated circuit design apparatus of the invention includes means (L) for laying out on a semiconductor substrate and providing layout information; means (R) for providing logical circuit information; means (L) for laying out on the semiconductor substrate based on the logical circuit information and obtaining layout information; means (A) for classifying logical circuits in response to the logical circuit propagation route of a signal based on the logical circuit information; and means (B) for isolating the logical circuits forming the route obtained in the classifying means (A) for each delay time; means (C) for classifying the elements making up the logical circuit according to substrate voltage for each delay time of the logical circuit; and layout correction means (D) for correcting the layout information so that each element with the larger delay time of the logical circuit is placed at a point closer to a substrate contact.

According to this configuration, it is made possible to easily lay out the circuit using the design tool.

A semiconductor integrated circuit of the invention is characterized by the fact that it has a plurality of flip-flop circuits and a plurality of logical circuits and including a larger number of substrate contacts in a region where the number of logical circuits each existing between output of a first flip-flop circuit of the plurality of flip-flop circuits and a signal line input to the first flip-flop circuit or a second flip-flop circuit is large than in a region where the number of logical circuits is small.

According to this configuration, MOS cells (transistors) making up a large number of logical circuits are at a shorter distance from a substrate contact than MOS cells making up a small number of logical circuits and thus a higher substrate voltage can be applied and accordingly only a necessary portion is driven at high speed, so that high-speed drive is made possible and applying a high voltage to an unnecessary cell can be prevented, so that it is made possible to prevent a leak current.

In the semiconductor integrated circuit of the invention, the substrate contacts are placed at random.

In the related art, at the forward substrate control time, in elements (for example, MOS transistors) common in WELL, the substrate potential rises without variation and thus the leak current increases. According to the invention, however, a high substrate voltage is applied only to the elements of a logical circuit where speeding up is required, so that finer substrate control is made possible. In addition, the semiconductor integrated circuit can operate at higher sped and can consume lower power and can prevent degradation of the circuit characteristic.

That is, it is necessary only to correct the layout and adjust the substrate contact and the substrate voltage to be supplied may be of only one type and thus WELLs which must essentially be isolated can be made common and the occupation area can be decreased. The number of types of power supply potentials to be generated can be decreased, so that a voltage generation circuit becomes unnecessary. Therefore, the occupation area can be decreased and the operation can be stabilized.

BRIEF DESCRIPTION OF THE DRAWINGS

FIG. 4 is a conceptual drawing to show the cell placement method of the first embodiment of the invention;

FIG. 5 is a substrate contact cell placement drawing of the first embodiment of the invention;

FIG. 9 is a conceptual drawing to show the cell placement method of the second embodiment of the invention.

DESCRIPTION OF THE PREFERRED EMBODIMENTS

Embodiments of a design method of a semiconductor integrated circuit device of the invention will be discussed below in detail based on the accompanying drawings:

To begin with, before the description of the embodiments of the invention, the concept as the background of the invention will be discussed.

Figure 1:
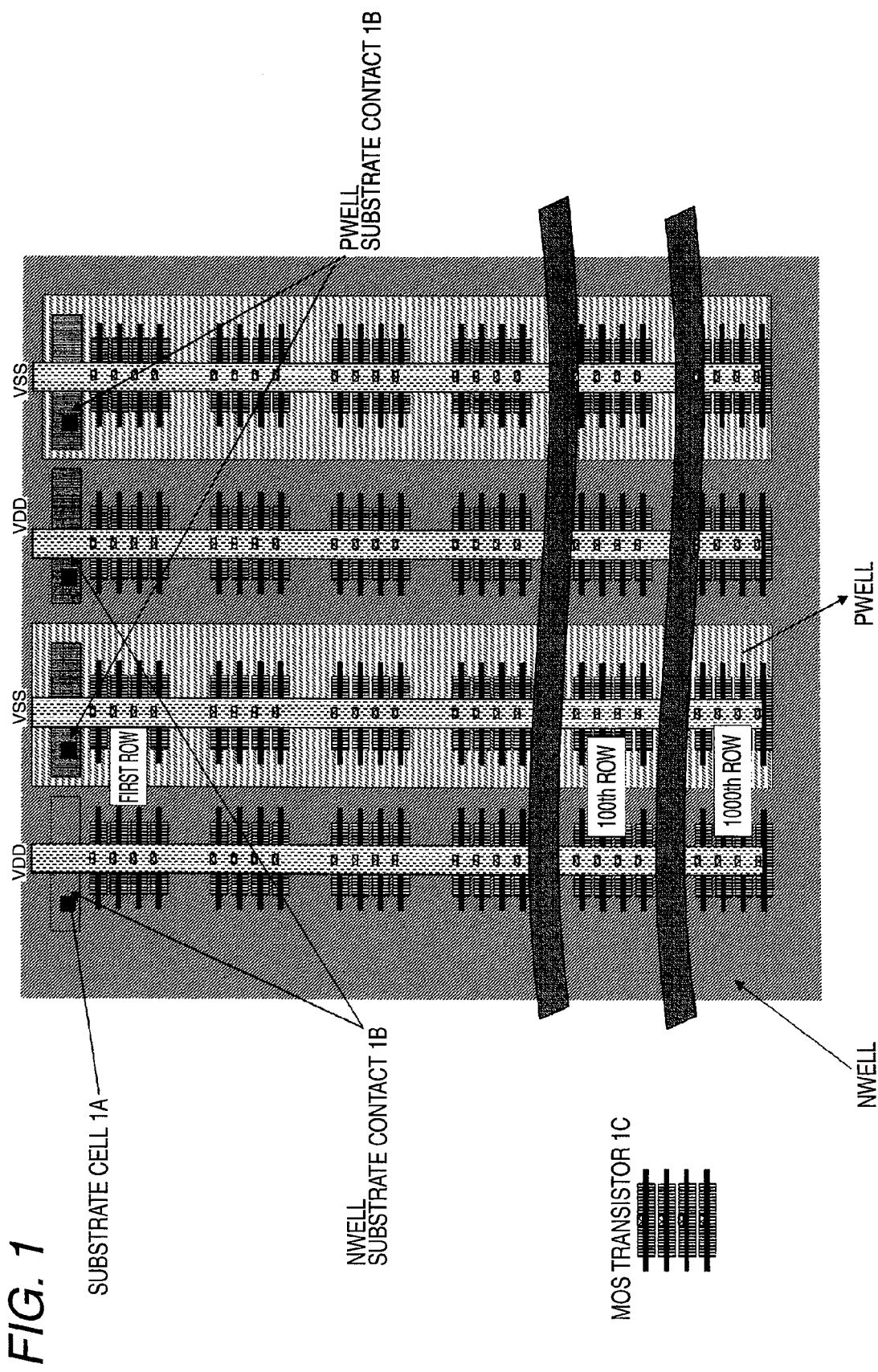
FIG. 1 is a drawing to show a usual semiconductor integrated circuit to describe the concept of a first embodiment of the invention.

FIG. 1 shows a usual layout of isolating the sources and the substrates of MOS transistors to perform substrate control of the MOS transistors. To isolate the substrates, a triple well structure is adopted and NWELL and PWELL are isolated from a silicon substrate (P-substrate) covered with deep NWELL. 1A denotes a substrate potential cell and a well substrate contact 1B exists in the substrate potential cell. 1C denotes a MOS transistor. 1000 rows of the transistors 1C exist on one WELL (in the longitudinal direction). As a result of conducting various experiments and considerations, the inventor et al., found the fact that in such a configuration, if a higher forward substrate voltage is applied, about a transistor at a distance from a substrate contact, when the forward substrate voltage is applied, the effect of a parasitic bipolar formed in a lateral direction is large and as the substrate voltage just below each MOS transistor, only a lower voltage than an external applied voltage is applied because of a leak current from the parasitic bipolar.

Figure 2:
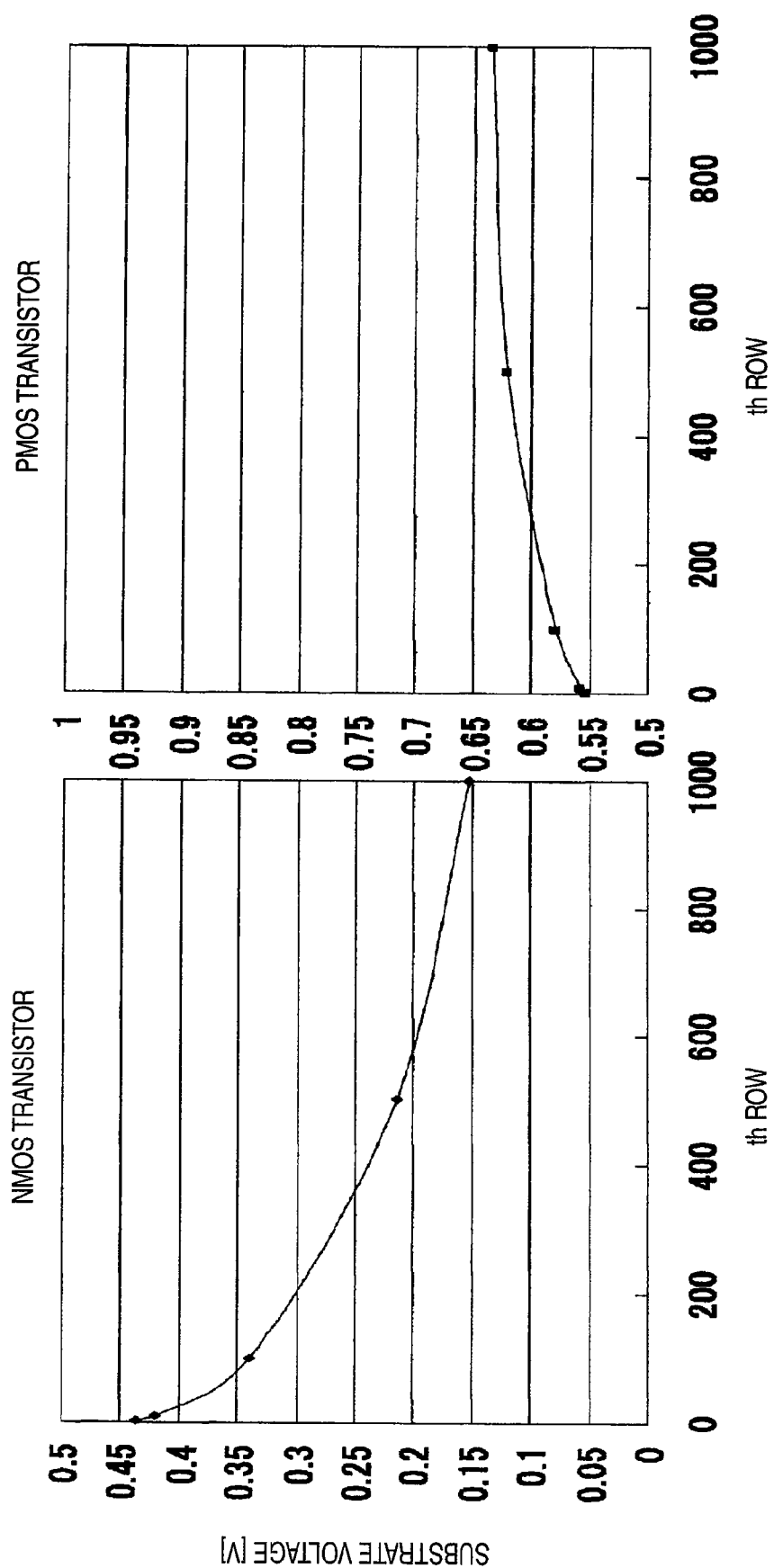
FIG. 2 is a drawing to show the relationship between the distance from a substrate contact of the semiconductor integrated circuit and substrate voltage.

FIGS. 2(a) and (b) show the measurement results. The horizontal axis indicates the distance from the substrate contact 1B shown in FIG. 1 to each MOS transistor 1C in units of the number of rows of transistors. The vertical axis indicates the substrate voltage actually applied to a part (channel part) just below each MOS transistor 1C. FIG. 2(a) shows the measurement result of the potential of PWELL when 0 V was applied to the source potential of an NMOS transistor and 0.45 V was applied to the substrate contact 1B. FIG. 2(b) shows the measurement result of the potential of NWELL when 1 V was applied to the source of a PMOS transistor and 0.55 V was applied to the substrate contact 1B. As seen in FIGS. 2(a) and (b), in the MOS transistor 1C close to the substrate contact 1B, the substrate voltage is almost the same as the external applied substrate voltage, but in the 100th row and later, the substrate voltage differs considerably from the external applied substrate voltage. Between data (a) based on NMOS transistor and data (b) based on PMOS transistor, it is seen that (b) involves smaller distance dependency of substrate voltage than (a).

That is, in a logical circuit made up of MOS transistors distant from the substrate contact 1B, the threshold value of the MOS transistor does not so lower and the delay of the MOS transistor does not improve. The advantage is that the leak current of the MOS transistor is smaller than that of the MOS transistor to which a higher substrate potential is applied. The PMOS substrate contact has the advantage that the WELL substrate potential is easier to maintain than the NMOS substrate contact.

The invention is embodied paying attention to the fact, and the design method of a semiconductor integrated circuit making the most of the fact will be discussed in first and second embodiments of the invention.

First Embodiment

Figure 3:
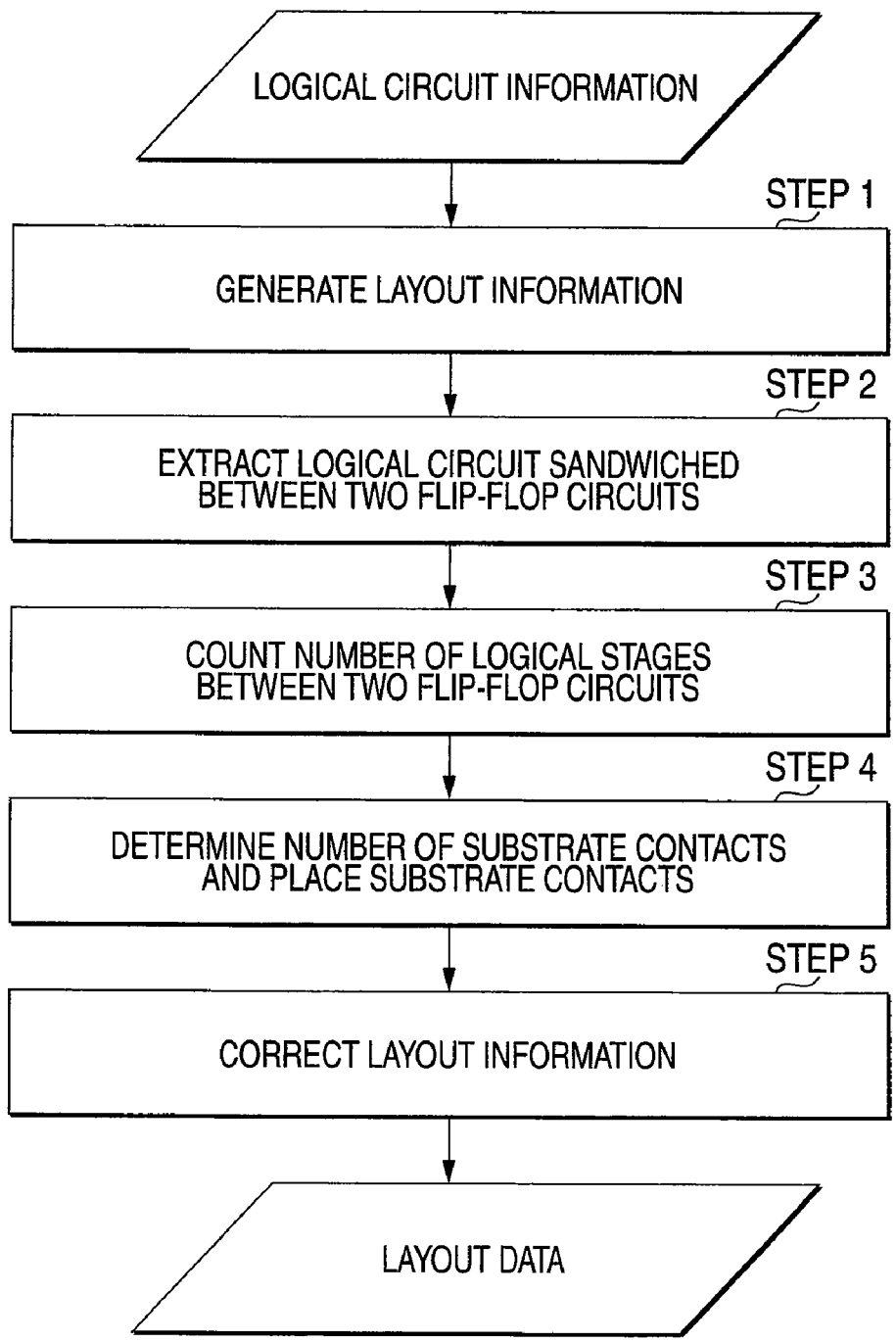
FIG. 3 is a flowchart of a cell placement method of the first embodiment of the invention.

FIG. 3 is a flowchart of a cell placement method for supplying an optimum substrate potential to each MOS transistor in a design method of a semiconductor integrated circuit of the first embodiment of the invention.

In the embodiment, in design of a semiconductor integrated circuit for implementing any desired function in clock synchronization, attention is paid to a complicated circuit between a signal line output from one flip-flop circuit and a signal line input to the same flip-flop circuit or a different flip-flop circuit and the logical circuit is designed.

The number of logical stages forming the logical circuit varies depending on the function. The expression "the number of logical stages" mentioned here is defined as the number of MOS transistors through which a signal passes in the route from a signal line output from one flip-flop circuit and a signal line input to the same flip-flop circuit or a different flip-flop circuit. The number of logical stages may be defined as the number of cells such as standard cells containing elements other than MOS transistors through which a signal passes rather than the number of MOS transistors.

That is, the method of the invention is characterized by the fact that it includes a step ($I_0$: STEP 1) of generating layout information from logical circuit information, a step (a) of classifying logical circuits in response to the logical circuit propagation route of a signal based on the logical circuit information, a step (b) of classifying the logical circuits forming the route obtained in the classifying step (a) for each number of stages, a step (c) of classifying the MOS transistors making up the logical circuit according to substrate voltage for each number of stages of the logical circuit, and a step (d) of correcting the layout so that each MOS transistor with the larger stage number of the logical circuit is placed at a point closer to the substrate contact.

The step (a) contains a step of extracting a logical circuit only between flip-flop circuits and only the logical circuits extracted in the extracting step are classified. In the step (d), the layout is corrected so that a MOS transistor with the larger stage number of the logical circuit is placed at a point closer to the substrate contact on a priority basis.

First, the logical circuit diagram is input and layout information is generated from the logical circuit information (STEP 1 in FIG. 3). Classification is performed in response to the logical circuit propagation route of a signal based on the logical circuit information and a logical circuit sandwiched between two flip-flop circuits is extracted (STEP 2 in FIG. 3). The number of logical stages of each route is counted (STEP 3 in FIG. 3) and case classification is performed in response to the number of logical stages.

Second, the number of logical stages and substrate voltage are associated with each other based on a table listing different substrate voltages in response to the number of logical stages. TABLE 1 shown in FIG. 4(a) is a table of the numbers of logical stages and substrate voltages. The routes are associated in accordance with TABLE 1.

Third, placement of substrate contacts in the layout region defined as the maximum applied substrate voltage value is determined according to substrate voltage and a frequency distribution of the numbers of logical stages of logical circuits (STEP 4 in FIG. 3). TABLE 2 shown in FIG. 4(b) is a correspondence table of the numbers of NWELL and PWELL substrate contacts with the substrate potential average values and substrate potential variance values, created based on a distribution drawing of number-of-logical-stages frequencies relative to the substrate potential. If the number-of-logical-stages frequencies concentrate on a place where the substrate voltage is high (the substrate potential average value is high), the number of placed substrate contacts is increased, because it is necessary to place a large number of MOS transistors in a place where the distance from the substrate contact is short. Conversely, if the number-of-logical-stages frequencies concentrate on a place where the substrate voltage is low (the substrate potential average value is low), the number of placed substrate contacts is decreased. The number of substrate contacts varies according to the substrate potential variance value.

Figure 6:
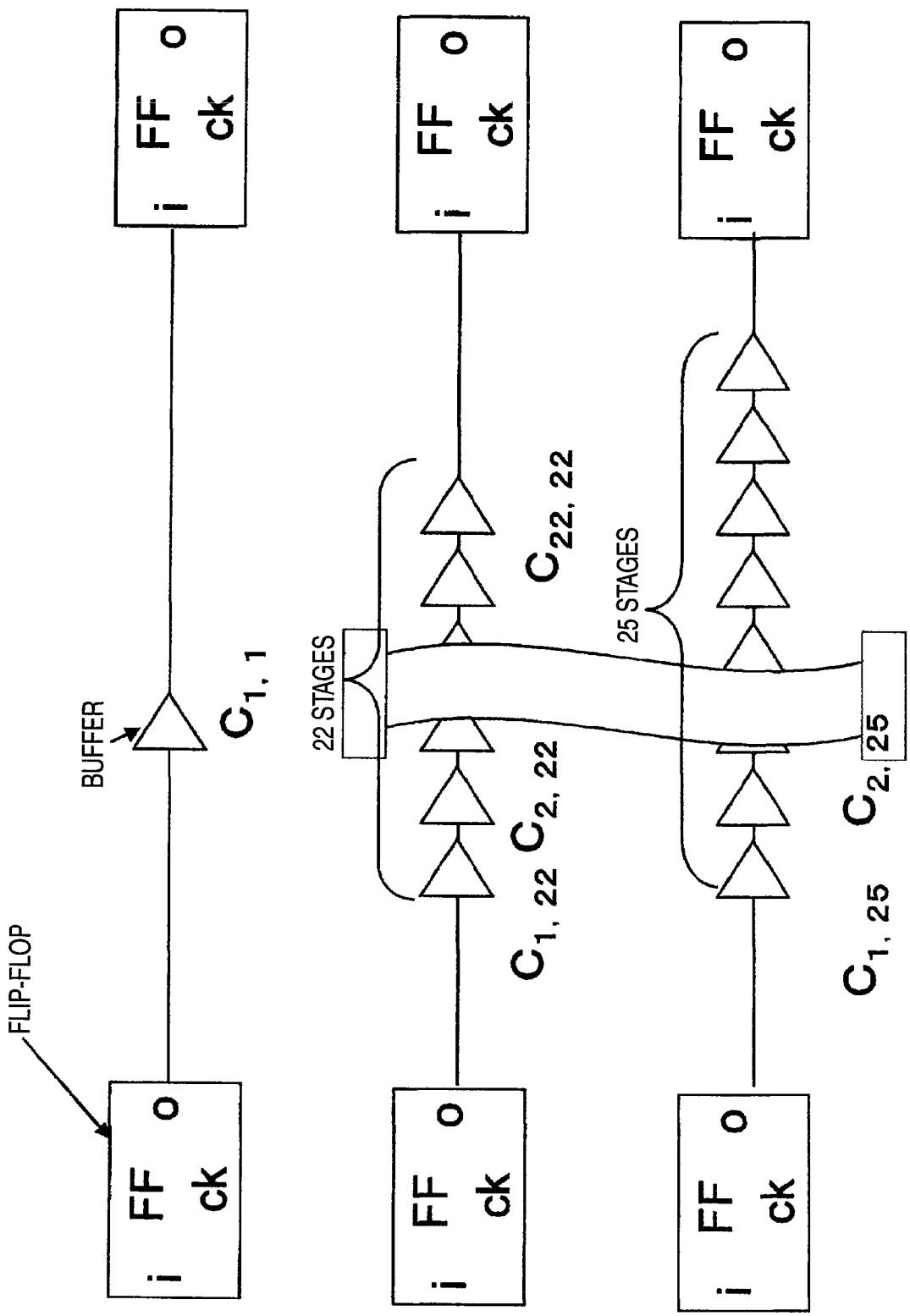
FIG. 6 is a drawing to show examples of equivalent circuits of logical circuits of the first embodiment of the invention.

FIG. 5 shows an example of the layout. FIG. 5(a) shows the case where the number-of-logical-stages frequencies concentrate on a place where the substrate voltage is low, and FIG. 5(b) shows the case where the number-of-logical-stages frequencies concentrate on a place where the substrate voltage is high. As the regions corresponding to a, b, and c in FIG. 5(b), for example, logical circuits as shown in FIG. 6 are possible. As shown in FIG. 6, a region where a logical circuit cell $C_{1,1}$ of one stage exists between flip-flop circuits FFs (region a), a region where logical cells of 22 stages, namely, a logical cell $C_{1,22}$ at the first stage, a logical cell $C_{2,22}$ at the second stage ..., a logical cell $C_{22,22}$ at the twenty-second stage exist (region b), and a region where logical cells of 25 stages, namely, a logical cell $C_{1,25}$ at the first stage, a logical cell $C_{2,25}$ at the second stage ..., a logical cell $C_{25,25}$ at the twenty-fifth stage exist (region c) are considered.

Fourth, the MOS transistors or the cells which are almost the same in the substrate potential are set to one group, a high substrate potential group (MOS transistors or cells of a route with a large number of logical stages) is placed at a close place from the substrate contact, and a low substrate potential group (MOS transistors or cells of a route with a small number of logical stages) is placed at a distance from the substrate contact, so that the wiring is corrected so as to implement the logic (STEP 5 in FIG. 3).

Figure 7:
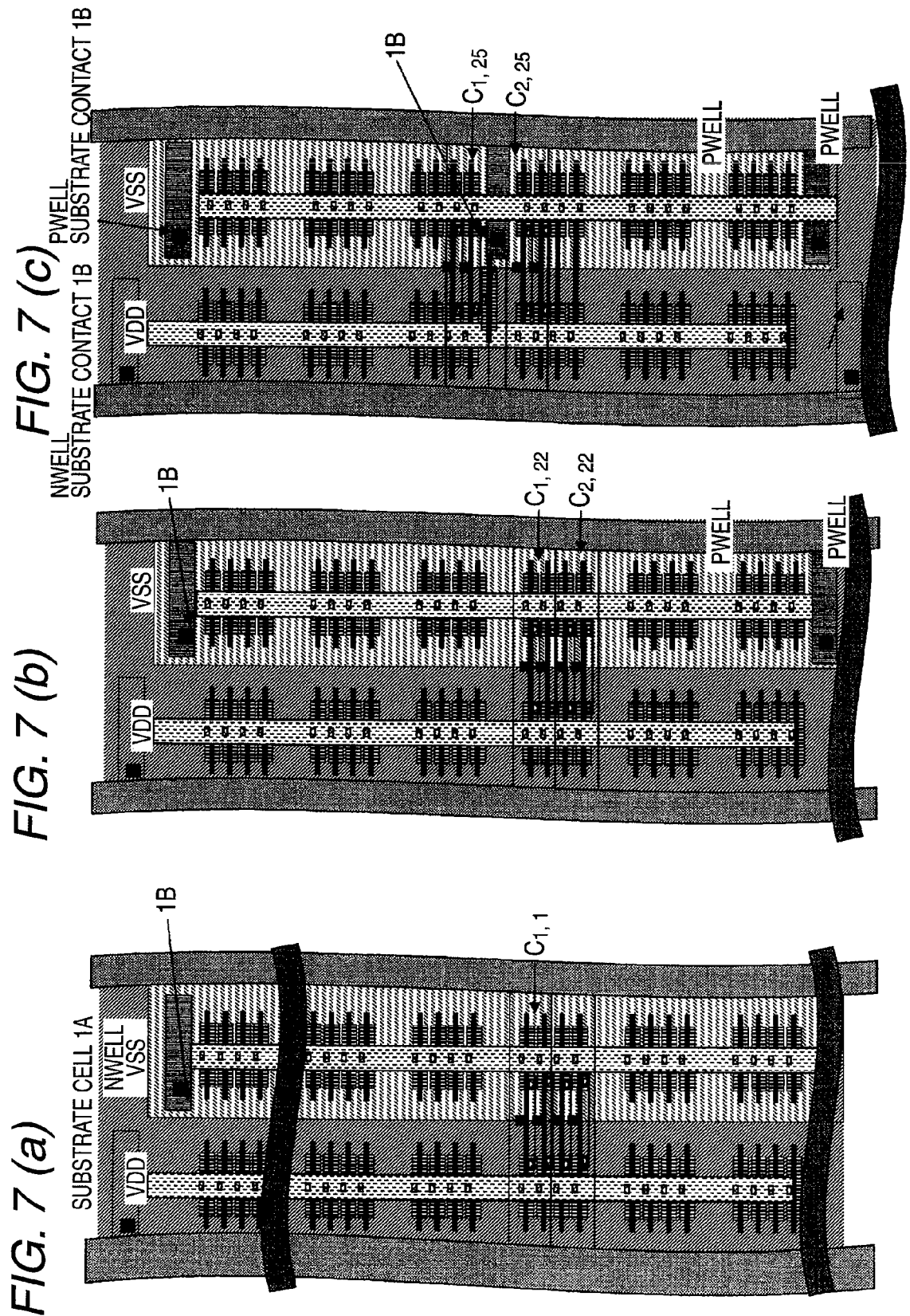
FIG. 7 is a drawing to show a semiconductor integrated circuit formed using the cell placement method of the first embodiment of the invention.

FIGS. 7(a) to (c) show the layouts of semiconductor integrated circuits implemented according to the method described above. FIG. 7(a) is a drawing to show the proximity of logical circuit cell when the logical circuit cell $C_{1,1}$ of one stage exists between flip-flop circuits FFs, FIG. 7(b) is a drawing to show the proximity of the logical circuit cells $C_{1,22}$, $C_{2,22}$ when logical cells of 22 stages exist between flip-flop circuits FFs, and FIG. 7(c) is a drawing to show the proximity of the logical circuit cells $C_{1,25}$, $C_{2,25}$ when logical cells of 25 stages exist between flip-flop circuits FFs. As seen in the figures, if only the logical circuit cell $C_{1,1}$ of one stage exists, no contact is formed in the proximity. On the other hand, in the region containing logical circuit cells of a large number of stages as 25 stages, substrate contact 1B is formed in the proximity as shown in FIG. 7(c).

According to the first embodiment, a logical circuit having a large number of logical stages is placed in the proximity of a substrate contact, the substrate potential is high, and high-speed drive is possible. On the other hand, a logical circuit having a small number of logical stages is placed at a distance from a substrate contact and the substrate potential is low.

In the related art, at the forward substrate control time, in MOS transistors common in WELL, the substrate potential rises without variation and thus the leak current increases. According to the invention, however, the positional relationship with each substrate contact is adjusted, whereby a high substrate voltage is applied only to the MOS transistors of a logical circuit where speeding up is required, so that finer substrate control is made possible and a faster semiconductor integrated circuit of lower power consumption with the circuit characteristic undegraded can be implemented.

Further, as compared with the related art, according to the invention, from the advantage that substrate control in a predetermined range is possible only with placement without isolating WELLs different in substrate potential, the area can be made smaller and a semiconductor integrated circuit having a small occupation area can be implemented. Particularly, a still more advantage is demonstrated in a logical circuit having a function with a large number of specific passed-through elements such as an adder or a multiplier.

Isolation to a plurality of wells may be executed so as to give a plurality of substrate potentials. Also in this case, a layout is designed so as to adjust the distance from a contact in each well, whereby the optimum substrate potential can be given to each cell.

In the embodiment, layout correction is made to the substrate contacts of both PWELL and NWELL; if substrate contact is formed on DPWELL, the potential of the DPWELL becomes dominant and thus the layout dependency of the PWELL substrate contact is small. Therefore, layout correction may be made only to the NWELL substrate contact.

On the other hand, for the substrate contacts of both PWELL and NWELL formed on DNWELL, the potential of the DNWELL becomes dominant and thus the layout dependency of the NWELL substrate contact is small. Therefore, layout correction may be made only to the PWELL substrate contact.

In the embodiment, because of correction after layout, often, placement of the substrate contacts is not aligned and the power supply wiring does not become linear.

Second Embodiment

Figure 8:
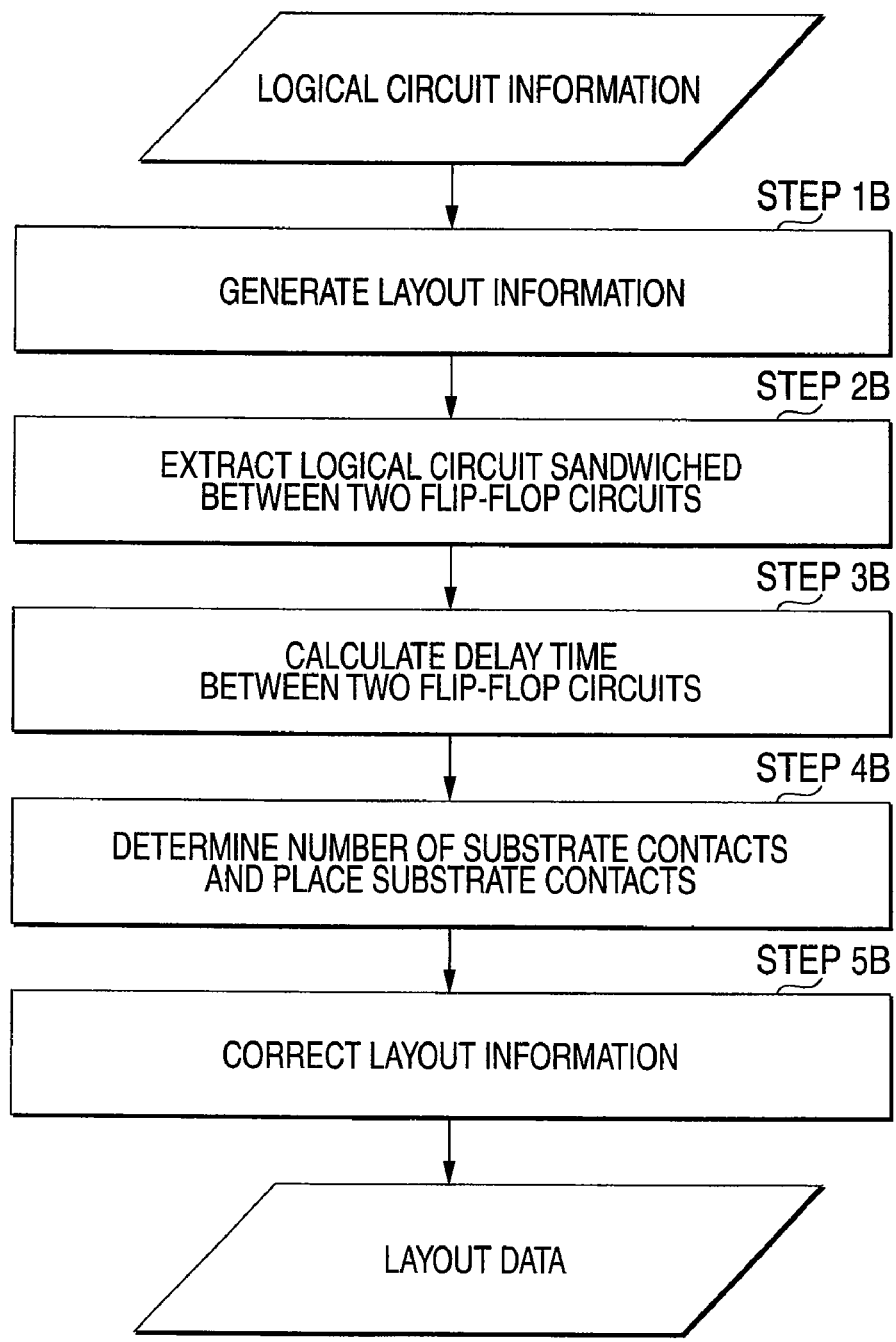
FIG. 8 is a flowchart of a cell placement method of a second embodiment of the invention.

In the first embodiment, the cell placement method responsive to the number of logical stages has been described. In a second embodiment, a method of acquiring delay information forming logic from a previously created table, inputting the delay information, and executing cell placement based on the delay information will be discussed. FIG. 8 is a flowchart to show the cell placement method of the second embodiment of the invention.

That is, the method of the invention is characterized by the fact that it includes a step (I:) of generating layout information based on logical circuit information, a step (a:) of classifying logical circuits in response to the logical circuit propagation route of a signal based on the logical circuit information, a step (b) of classifying the logical circuits forming the route obtained in the classifying step (a) for each delay time, a step (c) of classifying the MOS transistors making up the logical circuit according to substrate voltage for each delay time of the logical circuit, and a step (d) of correcting the layout so that a MOS transistor with the larger delay time of the logical circuit is placed at a point closer to the substrate contact.

The step (a) contains a step of extracting a logical circuit only between flip-flop circuits and only the logical circuits extracted in the extracting step are classified. In the step (d), the layout is corrected so that an NMOS transistor of the MOS transistors with the large delay time of the logical circuit is placed at a point close to the substrate contact on a priority basis.

First, a layout is designed from the logical circuit information (STEP 1B in FIG. 8).

Next, delay information is acquired for each logical circuit from the logical circuit information and a logical circuit sandwiched between two flip-flop circuits is extracted (STEP 2B in FIG. 8). The acquired information is input and how much the delay passed through each logic (from output of flip-flop to input of flip-flop) is, is calculated (STEP 3B in FIG. 8) and case classification is performed in response to the delay time.

Then, the delay time and substrate voltage are previously associated with each other based on a table listing different substrate voltages in response to the delay time. TABLE 1B in FIG. 8(a) is a table of the delay times and substrate voltages. The logical circuits different in pass-through transistors are associated in response to the delay time in accordance with TABLE 1B.

Placement of substrate contacts in the layout region defined as the maximum substrate voltage value is determined according to substrate voltage and a frequency distribution of the delay times of logical circuits (STEP 4B in FIG. 8). The delay information may be acquired by computation or can also be calculated using a delay information extraction program, etc., contained in a commercially available EDA tool, etc. If the delay time frequencies concentrate on a place where the substrate voltage is high, the number of placed substrate contacts is increased; if the delay time frequencies concentrate on a place where the substrate voltage is low; the number of placed substrate contacts is decreased. TABLE 2B shown in FIG. 9(b) is a correspondence table of the numbers of NWELL and PWELL substrate contacts with the substrate potential average values and substrate potential variance values (variance from average value), created based on a distribution drawing of number-of-logical-stages frequencies relative to the substrate potential.

Further, the MOS transistors or the cells which are almost the same in the substrate potential are set to one group, a high substrate potential group (MOS transistors or cells of a route with a long delay time) is placed at a close place from the substrate contact, and a low substrate potential group (MOS transistors or cells of a route with a short delay time) is placed at a distance from the substrate contact, so that the layout information is corrected so as to implement the logic and wiring is performed (STEP 5B in FIG. 8).

According to the second embodiment, a logical circuit of a route with a long delay time is placed in the proximity of a substrate contact and a logical circuit of a route with a short delay time is placed at a distance from a substrate contact.

In the related art, at the forward substrate control time, in MOS transistors common in WELL, the substrate potential rises without variation and thus the leak current increases. According to the invention, however, a high substrate voltage can be applied only to the MOS transistors of a logical circuit where speeding up is required, so that finer substrate control is made possible and a faster semiconductor integrated circuit of lower power consumption capable of preventing degradation of the circuit characteristic can be implemented.

Further, as compared with the related art, according to the invention, from the advantage that WELLs different in substrate potential need not be isolated and the advantage that the number of substrate contacts of one type of WELL may be small, a semiconductor integrated circuit with a smaller area can be implemented.

(Design Environment)

Figure 10:
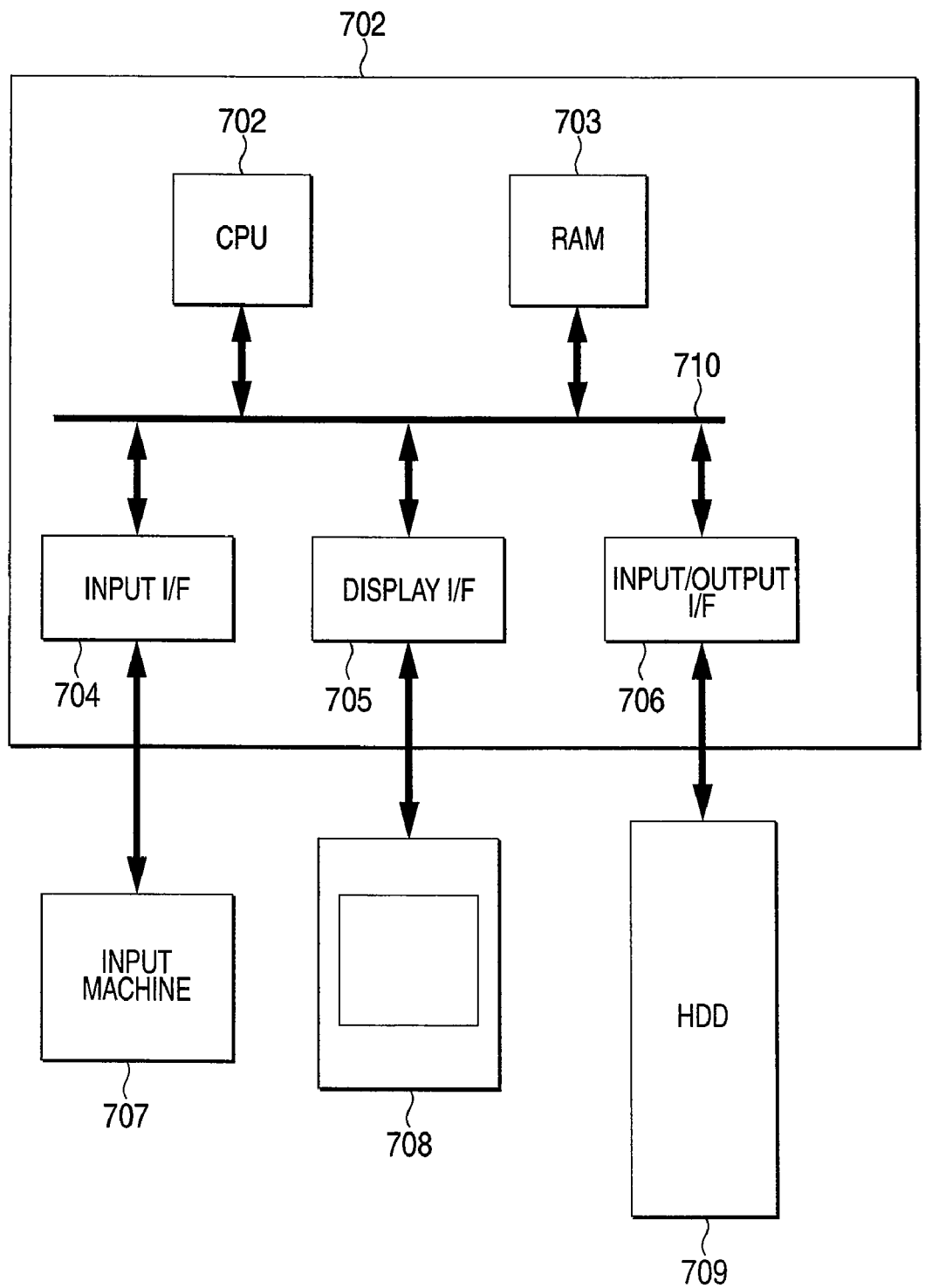
FIG. 10 is a block diagram to show a design environment for embodying the invention.

Last, a design environment for embodying the invention will be discussed. FIG. 10 is a block diagram to show an apparatus used in the design environment in which the invention is embodied. A design apparatus 701 includes a CPU 702, RAM 703, an input I/F 704, a display I/F 705, and an input/output I/F 706. These are all connected by a bus and can conduct data communications with each other. The input I/F 704 is connected to an input machine 707 for accepting input from a designer. As an example of the input machine 707, a keyboard and a mouse are available. The display I/F 705 is connected to a display 708 for the designer to view layout data, etc. An example of the display 708, a CRT display or a liquid crystal display is available. The input/output I/F 706 is connected to an HDD (hard disk drive) 709. An automatic layout tool for executing the design method of the invention shown in the first and second embodiments described above is stored in the HDD 709.

The automatic layout tool may be an independent tool or may exist as a part of any other tool. The layout data during the automatic layout or the finally obtained layout data is saved in the HDD 709 when necessary.

The CPU 702 processes the automatic layout tool stored as a program in the HDD 709 based on a command from the user entered through the input I/F 704. To process the program, the RAM 703 is used as a work area and data is written and read at a necessary timing. The designer writes and reads data into and from the RAM 703 in accordance with the program stored in the HDD 709 rather than explicitly enters a data write/read command into/from the RAM 703.

The designer can check progress information on the display 708. The finally generated timing data is output to the HDD 709 and the layout design containing cell placement is complete.

The design method of a semiconductor integrated circuit according to the invention is very useful for chip design of a semiconductor integrated circuit for realizing lower area and lower power consumption. Particularly, in the future, a long battery life in an apparatus using a battery as a power source can be ensured and the area can be reduced, so that more inexpensive and higher-performance semiconductor integrated circuit chips can be supplied to various apparatus.

What is claimed is:

1. A computer implemented semiconductor integrated circuit design method comprising:
    a step (l) of providing layout information for laying out elements making up a logical circuit on a semiconductor substrate;
    a step (p) of providing logical circuit information;
    a step (a) of classifying logical circuits in response to the logical circuit propagation route of a signal based on the logical circuit information and a step (b) of isolating the logical circuits forming the route obtained in said classifying step (a) for each number of stages;
    a step (c) of classifying the elements making up the logical circuit according to substrate voltage for each number of stages of the logical circuit; and
    a layout correction step (d) of correcting the layout information so that each element with the larger stage number of the logical circuit is placed at a point closer to a substrate contact, implemented by a central processing unit.

2. The semiconductor integrated circuit design method as claimed in claim 1 wherein said step of providing layout information includes a step of creating layout information based on the logical circuit information.

3. The semiconductor integrated circuit design method as claimed in claim 1 wherein said step (a) includes a step of extracting a logical circuit only between flip-flop circuits, wherein only the logical circuits extracted in the extracting step are classified.

4. The semiconductor integrated circuit design method as claimed in claim 1 wherein said step (d) is a step of laying out so that a MOS transistor with the larger stage number of the logical circuit is placed at a point closer to the substrate contact.

5. The semiconductor integrated circuit design method as claimed in claim 1 wherein said step (d) is a step of laying out so that an NMOS transistor of the MOS transistors with the larger stage number of the logical circuit is placed at a point closer to the substrate contact on a priority basis.

6. A semiconductor integrated circuit design apparatus comprising:
    means (L) for laying out on a semiconductor substrate and providing layout information;
    means (R) for providing logical circuit information; means (A) for classifying logical circuits in response to the logical circuit propagation route of a signal based on the logical circuit information; and means (B) for isolating the logical circuits forming the route obtained in said classifying means (A) for each number of stages;
    means (C) for classifying the elements making up the logical circuit according to substrate voltage for each number of stages of the logical circuit; and
    layout correction means (D) for correcting the layout information so that each element with the larger stage number of the logical circuit is placed at a point closer to a substrate contact.

* * * * *